US008575521B2

(12) United States Patent
Nenyei et al.

(10) Patent No.: US 8,575,521 B2
(45) Date of Patent: Nov. 5, 2013

(54) MONITORING WITNESS STRUCTURES FOR TEMPERATURE CONTROL IN RTP SYSTEMS

(75) Inventors: Zsolt Nenyei, Blaustein (DE); Paul Janis Timans, Mountain View, CA (US)

(73) Assignee: Mattson Technology, Inc., Fremont, CA (US)

( * ) Notice: Subject to any disclaimer, the term of this patent is extended or adjusted under 35 U.S.C. 154(b) by 1206 days.

(21) Appl. No.: 12/060,652

(22) Filed: Apr. 1, 2008

(65) Prior Publication Data

US 2009/0242543 A1   Oct. 1, 2009

(51) Int. Cl.
   *A21B 1/00*   (2006.01)
(52) U.S. Cl.
   USPC .......................................... 219/412; 219/413
(58) Field of Classification Search
   USPC ................ 219/405, 409, 390, 411–413, 416; 392/411, 414, 416; 118/50.1, 725, 728
   See application file for complete search history.

(56) References Cited

U.S. PATENT DOCUMENTS

| | | | |
|---|---|---|---|
| 5,359,693 A | 10/1994 | Nenyei et al. | |
| 5,831,249 A * | 11/1998 | Rohner et al. | ................ 219/413 |
| 5,841,110 A | 11/1998 | Nenyei et al. | |
| 5,861,609 A | 1/1999 | Kaltenbrunner et al. | |
| 6,121,580 A | 9/2000 | Tsukamoto | |
| 6,130,105 A | 10/2000 | Redinbo et al. | |
| 6,204,484 B1 * | 3/2001 | Tay et al. | ...................... 219/411 |
| 6,359,263 B2 | 3/2002 | Tay et al. | |
| 2003/0236642 A1 | 12/2003 | Timans | |
| 2007/0238202 A1 | 10/2007 | Ranish et al. | |
| 2008/0002753 A1 | 1/2008 | Timans | |

FOREIGN PATENT DOCUMENTS

DE   4437361   4/1996

OTHER PUBLICATIONS

Lercg, Wilfried et al., "Temperature Measurement of Wafers with Varying Multilayer Structures During Rapid Thermal Annealing," IEEE Transactions on Semiconductor Manufacturing, vol. 11, No. 4, Nov. 1998: pp. 598-606.
Shieh, Tsay-Jui et al., "RAPS—A Rapid Thermal Processor Simulation Program," IEEE Transactions on Electrical Devices, vol. 36, No. 1, Jan. 1989: pp. 19-24.
P.J. Timans, R.N. Morishige, Y. Wasserman, "Emissivity-independent Rapid Thermal Processing Using Radiation Shields," Mat. Res. Soc. Symp. Proc., vol. 470, 1997:7 pages.
Tiku, S.K, "Self-Compensation in Rapid Thermal Annealed Silicon-Implanted Gallium Arsenide," *J. Electrochem. Soc.* Sep. 1985: pp. 2237-2239.

* cited by examiner

*Primary Examiner* — Henry Yuen
*Assistant Examiner* — Phuong Nguyen
(74) *Attorney, Agent, or Firm* — Dority & Manning, P.A.

(57) ABSTRACT

Temperature control in an RTP system can be improved by consideration of one or more witness structures different from the wafer (or other semiconductor object) being processed. For example, power coupling between the RTP heating system and witness structure can be used to adjust one or more control parameters, such as model definitions, that are used by the RTP system to control wafer heating. As another example, a stored trajectory of a desired witness structure temperature or other property can be used as a basis for control during a processing cycle. Thus, the witness structure may be controlled "closed-loop" while the wafer is heated "open-loop." As a further example, a heat flux between the RTP heating system and witness structure can be used to determine radiant energy from the heating system that is incident on the witness structure. One or more control actions can be taken based on this incident energy.

3 Claims, 5 Drawing Sheets

MONITORING WITNESS STRUCTURES FOR TEMPERATURE CONTROL IN RTP SYSTEMS

BACKGROUND

Rapid thermal processing (RTP) systems play an important role in the production of modern semiconductor devices. An ongoing challenge in RTP systems (and other systems used to process semiconductor devices) is precise control of processing cycles, namely controlling the heating of the object (or objects) being processed in the RTP chamber. Such objects typically comprise wafers, but may further include other configurations (e.g. ribbons, panels, etc.).

An RTP system can include a heating system that comprises one or more devices, including, but not limited to, lamps or lasers. Typically, these devices direct radiant energy into the chamber during a processing cycle based on a control program. The control program comprises one or more parameters which are used to adjust the amount of power applied to the heating system.

For instance, in some systems, "closed-loop" control can be based on the temperature of a wafer being processed. The control program may receive data from one or more measurement devices that monitor the wafer temperature and adjust power settings of the heating system.

As another example, a wafer (or other object) may be processed under "open-loop" control wherein a predetermined set of control values are used to adjust the power settings of the heating system without regard to the wafer's status. For instance, in some systems, an instrumented wafer may be placed into a chamber that heats the wafer via a plurality of lamps. The lamp power settings over the course of the process may be controlled so that the wafer follows a desired temperature trajectory. The lamp power settings may be recorded and played back to control the heating of other wafers.

Ongoing developments in semiconductor structures, however, would be better supported in some instances by more precise temperature control during processing.

SUMMARY

As set forth below, temperature control in an RTP system can be improved by consideration of one or more structures other than the wafer (or other object) being processed. For purposes of clarity, such a monitor structure is referred to as a "witness structure" herein. The witness structure can comprise, for example, a slip-free ring positioned in the chamber. However, the witness structure may comprise any other object in the chamber other than the object (or objects) being processed. Although the examples herein discuss the use of a single witness structure, multiple witness structures could be considered together.

Use of a witness structure can enhance control in a number of ways. For instance, in some embodiments, the object(s) being processed may be heated under closed-loop control during a process cycle based on one or more control parameters and data obtained by monitoring the object(s). During the process cycle, the witness structure may also be monitored. The power coupling between the heating system and witness structure can be determined and may be used to adjust one or more of the control parameters. Thus, the witness structure can be used in a "diagnostic" manner. The control parameter(s) may be adjusted in real-time in some embodiments.

The control parameter(s) that are adjusted can comprise any parameters used to control the processing cycle. For instance, if a model of the thermal processing chamber is used in controlling the heating of the objects, then adjusting control parameter(s) may comprise adjusting the terms of the model. Depending on the particular parameter(s) that are adjusted, the heating during the current processing cycle may change after the adjustment. However, the adjustment may pertain to parameter(s) that only affect earlier parts of the processing cycle; accordingly, a change in radiant energy may only be observed in a subsequent cycle.

Additionally or alternatively, in some embodiments, closed-loop control of a heating system can be based on the witness structure, while the objects being processed (e.g. semiconductor wafer(s)) are essentially heated "open-loop." For example, an object to be processed can be placed into a chamber containing the witness structure. Radiant energy can be directed into the chamber during a processing cycle. During the processing cycle, one or more properties of the witness structure may be monitored and compared to a stored temperature (and/or other property) trajectory for the witness structure. The heating system can be commanded based on comparing the difference (if any) between the monitored property of the witness structure and the stored trajectory for the property.

In some embodiments, prior to performing such closed-loop control, the stored trajectory is obtained during a "training cycle." Put another way, a "master file" may be prepared for later use. Thus, the controller can operate in a training mode and in a processing mode.

Namely, a training object to be processed can be placed into the chamber containing the witness structure. Energy can be directed into the chamber over the training cycle, during which control system is used to achieve a desired thermal response of the training object. For example, the temperature of the training object can be controlled in any suitable manner in order to match a desired temperature trajectory. As another example, the distribution of energy applied to the training object can be controlled, such as by varying the ratio of power between lamps in the heating system in order to achieve a controlled temperature distribution across the training object over time. This could be achieved, for example, by monitoring the temperature of the training object in multiple locations and adjusting the distribution of applied power accordingly.

Simultaneously, one or more properties of interest of the witness structure are monitored during the training cycle. For example, a temperature trajectory of the witness structure over the training cycle may be obtained by monitoring via a pyrometer or other sensor. The witness structure trajectory showing its temperature (and/or other property) over the course of the cycle may be stored in a machine-readable medium (e.g. in memory, on one or more disks, etc.). The stored trajectory can then be used during a subsequent cycle for processing an object which is essentially heated "open-loop" while the stored trajectory is used for closed-loop control relative to a property (e.g. temperature) of a witness structure.

For example, after the training cycle, the training object can be removed. In a subsequent cycle in which the tool operates in "processing mode" (as opposed to "training mode), the heating system can be commanded in order to attempt to match the trajectory of the property of interest for the witness structure to the stored trajectory. For instance, the ratio of power between lamps in the heating system can be varied so that the witness structure property of interest tracks the stored trajectory. As another example, the amount of power applied via the heating system can be varied so that the witness structure property of interest tracks the stored trajectory.

In certain embodiments, the witness structure can be monitored during a process cycle over time and its thermal response can be thereby determined. The thermal response of the witness structure can be used to determine the amount of radiant energy incident on the witness structure, and a control decision can be made based on the amount of energy incident on the witness structure. For instance, if warranted, the amount and/or distribution of radiant energy directed into the RTP chamber can be changed. In some instances, of course, the control decision may simply be to maintain the current amount of radiant energy directed into the chamber. In some embodiments, the control decision is made without a need for determining the amount of radiant energy incident on the object being processed.

In some embodiments, the amount of radiant energy determined to be incident on the witness structure can be used to infer the amount of radiant energy incident on the object(s) being processed. Even in such instances, though, no actual measurement of the energy incident on the object(s) to be processed is necessary.

In some embodiments of the present subject matter, the data from observing the witness structure can be used to change the total amount of radiant energy directed into the chamber during a heating cycle. For example, in certain embodiments, the control parameter(s) are adjusted in order to reduce error between a desired temperature target and an actual temperature of the object(s) to be processed. Additionally or alternatively, the distribution of radiant energy may be adjusted based on witness structure data. For instance, if the object being processed comprises a plurality of zones and the heating system can be controlled on a zone-by-zone basis, the heating applied to one or more zones may be adjusted.

BRIEF DESCRIPTION OF THE DRAWINGS

A full and enabling disclosure including the best mode of practicing the appended claims, directed to one of ordinary skill in the art, is set forth more particularly in the remainder of the specification, which makes reference to the appended figures, where like reference numerals are intended to represent analogous features, and in which:

DETAILED DESCRIPTION

Reference will now be made in detail to various embodiments of the present subject matter, one or more examples of which are illustrated in the accompanying drawings, with like numerals representing substantially identical structural elements. Each example is provided by way of explanation, and not as a limitation. In fact, it will be apparent to those skilled in the art that modifications and variations can be made without departing from the scope or spirit of the disclosure and claims. For instance, features illustrated or described as part of one embodiment may be used on another embodiment to yield a still further embodiment. Thus, it is intended that the disclosure herein includes modifications and variations as come within the scope of the appended claims and their equivalents.

Figure 1:
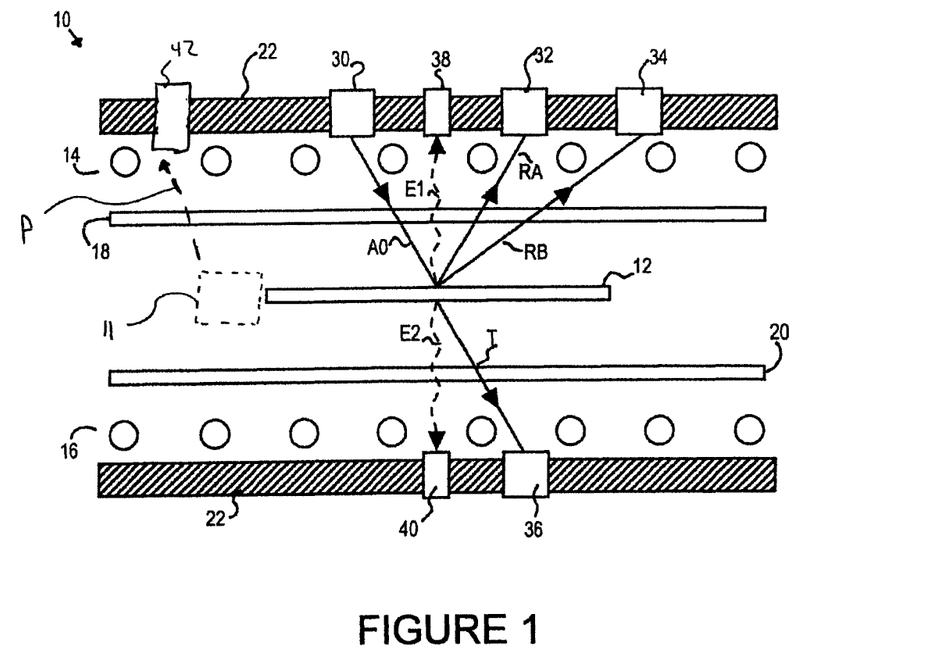
FIG. 1 is a diagram showing an exemplary processing chamber, witness structure, and wafer positioned therein.

FIG. 1 illustrates an exemplary RTP process chamber 10 where the wafer 12 is heated by a heating system comprising banks of lamps 14 and 16. In the example shown the banks of lamps are both above (14) and below (16) the wafer. The wafer is supported within a process environment that is isolated from the surroundings by windows both above (18) and below (20) the wafer 12.

FIG. 1 also illustrates a generalized witness structure 11. Details of exemplary witness structures will be discussed below. It will be understood that one or more witness structures may be placed in the chamber at any suitable location.

One of skill in the art will recognize that chamber 10 is merely exemplary, and the embodiments disclosed herein are equally usable in other types of chambers and chambers including configurations other than what is shown in FIG. 1. For instance, although lamps are shown above and below the wafer, this is not necessarily the case in other chamber designs. Indeed, in other suitable chambers, the heating system may differ. For example, the lamps may be replaced or supplemented by other heating sources, such as different lamp arrangements, a susceptor, hot plate, or other contact-based heating approach, conductive and/or convective heating, heating.

Additional examples of heating systems that use radiant energy can comprise RF or microwave sources, lasers (including, but not limited to continuous wave or pulsed lasers), and particle beams. Such sources may be scanned across portions or regions of the wafer in a controlled manner to achieve the desired heating.

It should also be understood, however, that besides wafers, chamber 10 may also be adapted to process optical parts, films, fibers, ribbons, and other substrates. Thus, the use of the term "wafer" in the present disclosure is for example only, and is not meant to exclude any other particular shapes or substrates from the general term "object to be processed."

One of skill in the art will recognize that a variety of processes may be carried out in chambers such as the one illustrated in FIG. 1 and for which accurate temperature measurements may be desired. For instance, the chamber may be configured and used for heat treatment or annealing of a substrate, during oxidation of the substrate, diffusion treatment, or during other processes which modify, add films, or otherwise involve a reaction of the surface and/or other part(s) of the substrate. Other processes may include any suitable film deposition process, such as a chemical vapor deposition process or an atomic layer deposition process. Still further processes may include plasma processing, ion implantation, ion implantation damage annealing, silicide formation, reflow, depositing a material on a substrate, or etching a substrate.

The windows may be made of quartz glass, sapphire, AlON, or any other material that can transmit the energy from the lamps to the wafer. The lamps are contained within a chamber that has walls 22. The walls may reflect lamp radiation to improve the coupling of lamp energy to the wafer.

Although energy is indicated as being projected through the same windows as used by the various sensors to monitor emitted, reflected, and transmitted energy, chambers may be configured so that energy is projected through windows separate from those through which the emitted, reflected, and transmitted energy is monitored. In fact, each such sensor could have a separate window, and any window could be configured to transmit or block certain ranges of energy in order to enhance measurement capabilities of the system.

The system also has various sensors and optical instruments that can be used to monitor the wafer and/or witness structure during processing, as well as other equipment (not shown) to implement wafer processes, such as gas inlets/outlets, cooling systems, and the like.

FIG. 1 shows an exemplary configuration of instruments and sensors and an exemplary light source 30. Light source 30 is a source, or combination of sources, that can illuminate the wafer surface by emitting a ray A0 that is incident on the wafer. The reflected light ray RA corresponds to an essentially specular reflection from the surface of the wafer. The reflected energy in ray RA can be detected by a sensor 32. The reflected or scattered light ray RB corresponds to energy from ray A0 that is reflected in a non-specular direction. Such a ray can arise if the ray A0 encounters a surface in the wafer that is inclined relative to the surface that produces reflected ray RA. It can also arise from a scattering effect or a diffraction effect. The energy in ray RB can be detected by a sensor 34.

Some of the energy from A0 may also pass through the wafer, forming a transmitted ray T. The energy in this ray can be detected by a sensor 36. Either or both reflected rays may be the result of partial transmission through, and then reflection by, the wafer (e.g. a ray that passes through an outer layer of the wafer and then is reflected by one or more layers below). In some embodiments, sensors may monitor for light transmitted or partially transmitted through wafer 10 from the bottom side to the top side of the wafer. Additionally, a monitored transmitted ray may be one that was transmitted in a non-specular or a specular direction. Further, although a separate light source 30 is shown, any optical measurements could additionally or alternatively be based on light originating from heating lamps or sources (14 and/or 16) that is transmitted, reflected, and/or scattered by the wafer.

Sensors can also monitor energy emitted by wafer 12 itself. For example, a hot wafer will emit thermal radiation. Sensor 38 can detect the radiation E1 that is emitted from the top surface of the wafer. Sensor 40 can detect the radiation E2 that is emitted from the bottom surface of the wafer. The angle of incidence of ray A0, and the angles at which the various sensors view the wafer surface can be selected as desired. Furthermore, the wavelength of the radiation emitted by source 30 can be selected as desired.

Source 30 may be a narrow band source, such as a laser, or a broadband source such as a lamp, an LED, a superluminescent LED, a super-continuum light source or a hot object. In some applications it may even be an RF source, a microwave source, or a THz radiation source, for example. In general it is a source of electromagnetic radiation, emitting radiation in the wavelength range between 100 nm and 1 m. The wavelength range emitted by source 30 can be selected or altered by the use of optical filters. When laser sources are used, the wavelength can be selected, for example, by choice of the type of laser, or by using a tunable laser, or a multi-wavelength laser and by manipulating the laser wavelength through the use of non-linear optical media such as frequency doublers and mixers. The state of polarization of the light emitted from source 30 can also be controlled. For laser sources, which often produce polarized light, this may involve controlling the orientation of the laser and/or manipulating the orientation of the beam to obtain a particular state of polarization with respect to incidence of the ray A0 on the wafer surface.

For all sources 30, the polarization may also be controlled by the use of polarizing and/or retarding optical elements. The output of energy from source 30 may be continuous, pulsed or modulated so that it varies with time. The state of polarization, the angle of incidence and the wavelength may also be modulated if desired. Although the radiation from source 30 is shown passing through the window, it may also be guided into the process environment by other means, such as light pipes, waveguides or optical fibers. In some cases the radiation from source 30 might not be able to pass through the window material selected from transmission of lamp radiation. In this case a separate section of the window can be included, which is made of a material that allows passage of the energy from source 30.

Filtering and polarizing elements can also be included in the optics in front of the sensors 32, 34, 36, 38, and 40. Such filters can be used to determine the state of polarization and the wavelength range of the energy that is detected in the rays that are reflected, scattered, transmitted or emitted by the wafer.

As noted in further detail below, the chamber may include additional measurement devices devoted to observing witness structure 11. Generally speaking, any of the techniques noted above for use in observing wafer 12 may be used to observe/monitor witness structure 11 during a processing cycle. For purposes of this example, FIG. 1 shows a generalized witness structure 11 in phantom and a single monitoring device 42. The dashed line P indicates that one or more properties of witness structure 11 are observed by monitoring device 42.

In some embodiments, one or more pyrometers are included in chamber 10 and are configured to observe witness structure 11 and determine the temperature of witness structure 11 based on radiation thermally emitted from witness structure 11. The pyrometer can be of a non-contact form in some embodiments.

RTP chamber 10 and its components may be linked to a controller or controllers (not shown in FIG. 1) for accumulating and processing measurement results and controlling the light sources, heat sources, and other components used in carrying out treatment processes. For example, the light sensors and pyrometers may be linked to appropriate circuitry and/or one or more processors running algorithms to implement the various methods disclosed herein and perform various tasks.

As one example, a computer system can be configured to obtain data based on the instrument(s) observing witness structure 11 and to make control decisions and/or adjust control parameters in light of the obtained data. Further, in some embodiments, the wafer is also observed, and the value of one or more of its properties is also factored into the control decision.

It will be understood that any suitable combination of software and/or hardware can be used to control the sensors and/or other aspects of RTP chamber 10 and to perform processes on wafers/objects therein. Software does not need to be used in all embodiments though; for instance, in some embodiments, the controller is implemented purely using hardware.

The witness structure may comprise any suitable form. For instance, it may be advantageous for a witness structure to comprise one or more structures that are already included in the chamber for another purpose. Thus, in several examples below, the witness structure comprises structures such as a slip-free ring surrounding the wafer and/or a shield between the heat source and the wafer. However, in certain embodiments, the witness structure comprises a body placed in or affixed to the chamber without any other function beyond serving as a witness structure.

Generally speaking, the witness structure can be formed of any suitable material that sufficiently absorbs radiation directed into the chamber. For example, the witness structure can be made from silicon, silicon carbide, or graphite in some embodiments, which may suitably absorb radiation generated when lamps are used in heating system.

In some embodiments, the witness structure can be adapted to pass radiation. For instance, if lamps are used, the witness structure could be made from a material transparent to the lamp radiation, such as quartz, sapphire, or AlON (aluminum oxynitride). This may be advantageous when the witness structure is used for measurements of radiation flux, such as radiation from the wafer, from quartz windows of the chamber, and/or radiation from other sources in the chamber. The witness structure can be configured to pass radiation of one or more wavelengths, or wavelength ranges, while absorbing or reflecting other radiation wavelengths or ranges.

Of course, the properties of the witness structure can be adjusted to best suit the type of observation(s) performed on the witness structure. For example, the witness structure could be doped and/or coated to affect its radiative properties. These aspects could be used to change the emittance, absorptance, transmittance, and/or reflectance of the structure as desired. As yet another example, the thermal mass of the witness structure can be adjusted and selected by changing its size/thickness and/or selecting materials with appropriate density and specific heat capacity.

Independently of sensing performance, use of coating, doping, or other adjustments and material selection can be made in order provide thermal/chemical stability of the witness structure and/or to prevent or reduce the chance of chamber contamination. For example, a coating of silicon nitride or aluminum oxide may make the witness structure more stable when used in an oxidizing environment so that its optical properties do not change over time or such change is minimized. Other examples of coatings include oxides, nitrides, carbides, carbon, diamond, or even coatings of semiconductors, such as polysilicon.

Figure 2A:
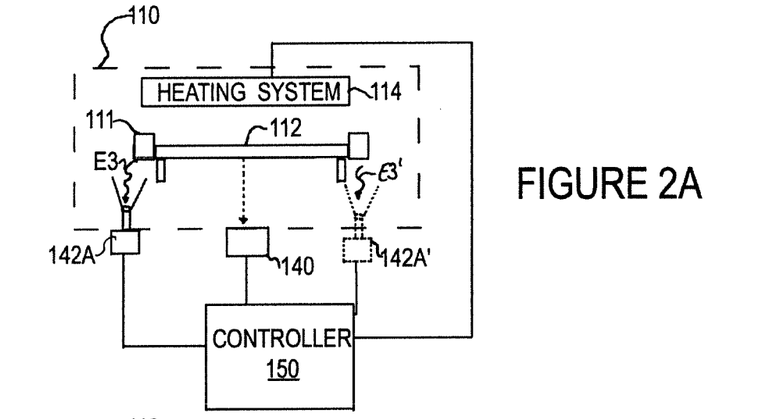
FIGS. 2A, 2B, and 2C each depict aspects of an exemplary processing chamber from the side and each show an example of observing a witness structure.
Figure 2B:
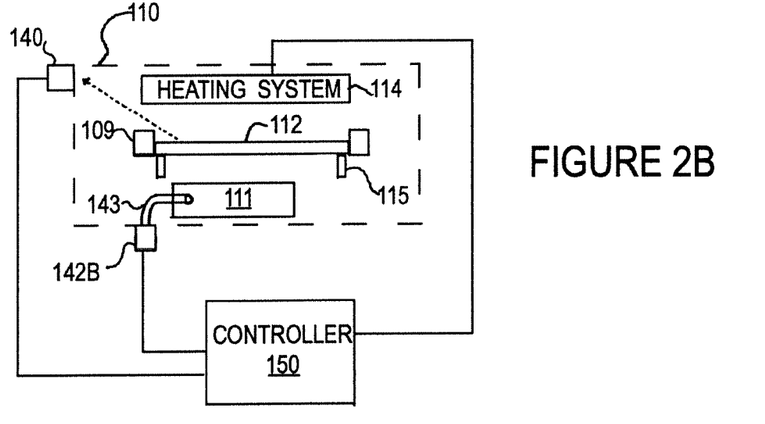
Figure 2C:
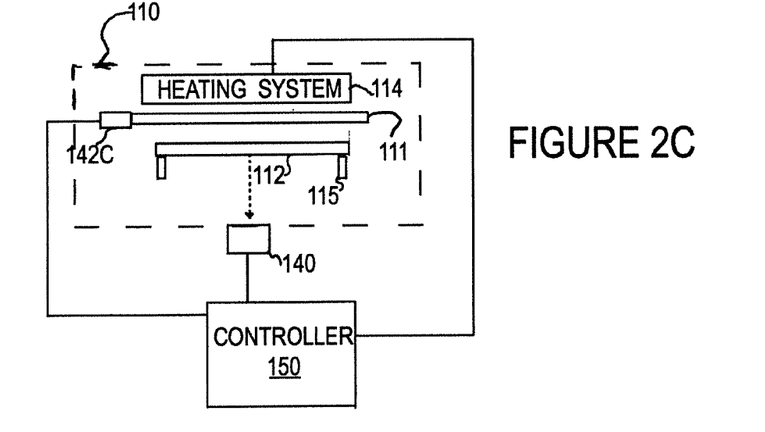

FIG. 2A shows an example of non-contact monitoring of a witness structure 111, which in this example comprises a slip-free ring surrounding a wafer 112 in chamber 110. It will be understood that the view of chamber 110 is greatly simplified, and the details of heating system 114 and other aspects of chamber 110 (such as process gas inlets, outlets, etc.) are omitted in FIGS. 2A-2C. Additionally, FIGS. 2A-2C depict controller 150 generally. As was noted above, controller 150 can comprise any suitable hardware and/or software used to regulate the thermal treatment process.

One additional measurement device 140 is shown observing wafer 112. For example, measurement device 140 may represent one or more pyrometers or other sensors configured to monitor the optical properties of wafer 112 in order to determine its temperature, such as by observing light transmitted through and/or emitted by wafer 112.

In this example, a single pyrometer 142A is shown monitoring one side of the slip-free ring comprising witness structure 111 to observe emitted radiation E3. Generally speaking, a slip-free ring refers to a device that completely encircles or at least substantially surrounds the edges of a wafer in order to counteract heat losses that occur at the wafer's edge. Another pyrometer 142A' is shown in phantom monitoring the other side of the slip-free ring to observe emitted radiation E3'. This is to indicate that the witness structure can be observed at a single location or at multiple locations.

It will be recognized, of course, that regardless of the form of the witness structure or method of observation, multiple observation points can be used to further improve results.

Additionally, regardless of the form of witness structure 111, it can be customized for accurate temperature measurements. For example, if a pyrometer is used to observe radiation emitted by witness structure 111, its emittance can be pre-defined in order to obtain accurate readings. A high emittance can be selected, for example by applying a coating such as silicon nitride to witness structure 111, so that the emittance is enhanced at the pyrometer wavelength.

In certain embodiments in which a pyrometer is used to observe witness structure 111, the pyrometry can be carried out by way of a light pipe or optical fibre that is connected to or embedded in witness structure 111. This approach is shown in FIG. 2B and may be convenient for providing a known emittance and for eliminating the effects of lamp radiation on the reading. In this particular example, chamber 110 is again depicted along with wafer 112, heating system 114, a measurement device 140 (depicted as observing light emitted by wafer 112), and controller 150. In this example, wafer 112 is supported by supports 115 and is surrounded by a slip-free ring 109.

Witness structure 111 comprises a separate element from the slip-free ring in this example. Although shown in an exaggerated view, witness structure 111 may comprise, for example, a liner or shield included in the chamber. Generally, the dimensions of the witness structure relative to the chamber and wafer can be varied for best results given the measurement and monitoring techniques at hand.

Further in this example, light pipe 143 is embedded within witness structure 111 and is connected to pyrometer 142B. Although in this example a light pipe is used with a separate witness structure, it should be understood that a light pipe or fiber optic could be embedded in a slip-free ring or in whatever other form the witness structure takes in other embodiments.

Additionally or alternatively, a contact-based measurement technique may be used to monitor witness structure 111. For example, witness structure 111 may include or may be placed in contact with a thermocouple 142C as shown in FIG. 2C. Additionally, in the example of FIG. 2C, witness structure 111 is shown in the form of a shield positioned between wafer 112 and heating system 114. Although the contact-based measurement device of this example is a thermocouple, contact-based pyrometry could be used in some embodiments. Additionally, the thermocouple or other contact-based measurement device could be embedded or sealed inside the witness structure.

Although emitted energy can be used in some embodiments, other radiation may be measured. For example, one or more other optical measurements can be performed as noted above, such as measuring radiation transmitted, reflected, and/or absorbed by witness structure 111.

In some embodiments, one or more radiation sources can be configured for use in observing witness structure 11. For example, if reflected or transmitted light is used for observing the witness structure, a source can direct light toward the witness structure. Of course, radiation produced by the heating system and reflected (and/or transmitted or absorbed) by the witness structure may be measured in some embodiments. If additional radiation sources are used for monitoring the wafer in the chamber, the same sources could be configured to direct light to the witness structure for measurement purposes. Alternatively, the witness structure measurements could be obtained using dedicated sources separate from sources used for measurements of wafer properties.

In some embodiments, the temperature of the object being processed and/or witness structure can be established by measuring the degree of optical absorption at a given wavelength in a part of the object that comprises silicon. For example the optical absorption may be obtained from a measurement of the transmittance of a wafer that includes a silicon layer, as described in U.S. patent application Ser. No. 10/178,950, filed Jun. 24, 2002 and published as US20030236642A1 on Dec. 25, 2003.

As another example, the optical absorption may be obtained from a measurement of the reflectance of a wafer including a silicon layer, as described in U.S. patent application Ser. No. 11/478,312, filed Jun. 29, 2006 and published on Jan. 3, 2008 as US20080002753A1. In general, any optical measurement that is sensitive to the degree of absorption in a silicon material can be used. Other types of optical measurement can include measurements of absorptance or emittance. In fact, any phenomenon sensitive to absorption could be exploited to deduce an absorption coefficient, and so the present subject matter is not limited only to measurements involving standard optical properties. As but one example, it is possible to determine temperature by sensing other optical properties, such as sensing the refractive index of silicon.

Some embodiments may rely on observing other properties or characteristics of a witness structure. For example, a witness structure may comprise a fluorescent material and the fluorescence decay time can be observed. Based on the observation, the temperature of the witness structure can be determined. As another example, an electrical property of the witness structure can be observed, such as a temperature-dependent electrical resistance.

Additionally, as was noted above, at least with regard to the witness structure, the temperature may be obtained through contact-based measurement, such as via a thermocouple.

Further, in some embodiments, the temperature per se of the witness structure and/or the object being processed may not be needed. For example, a control program may be appropriately configured to base decisions based on one or more measurements indicative of temperature without necessarily requiring temperature itself to be determined. For example, since absorptance of an object can be correlated to the temperature of the object (assuming other properties of the object are known), control decisions could be based on a measurement of absorptance.

As another example, data from measurement devices could be operated on without necessarily converting such data to values. This may especially be true in implementations in which the controller uses minimal or no software. For example, a measurement device may provide a signal whose value (e.g. voltage, current) tracks temperature or other properties of interest, and the signal could be amplified or otherwise manipulated or considered to control other aspects of the process without conversion to an actual value for an optical property (or other property).

Next, this specification will discuss three exemplary situations in which control is improved through monitoring a witness structure. It should be understood that any of the three types can be used to control an RTP system. However, any of the techniques discussed herein can be combined with one another and/or other control techniques.

A. Observing Witness Structure while Wafer is Under Closed-Loop Control to Deduce Power Coupling and Adjust Control Parameter(s)

Figure 3:
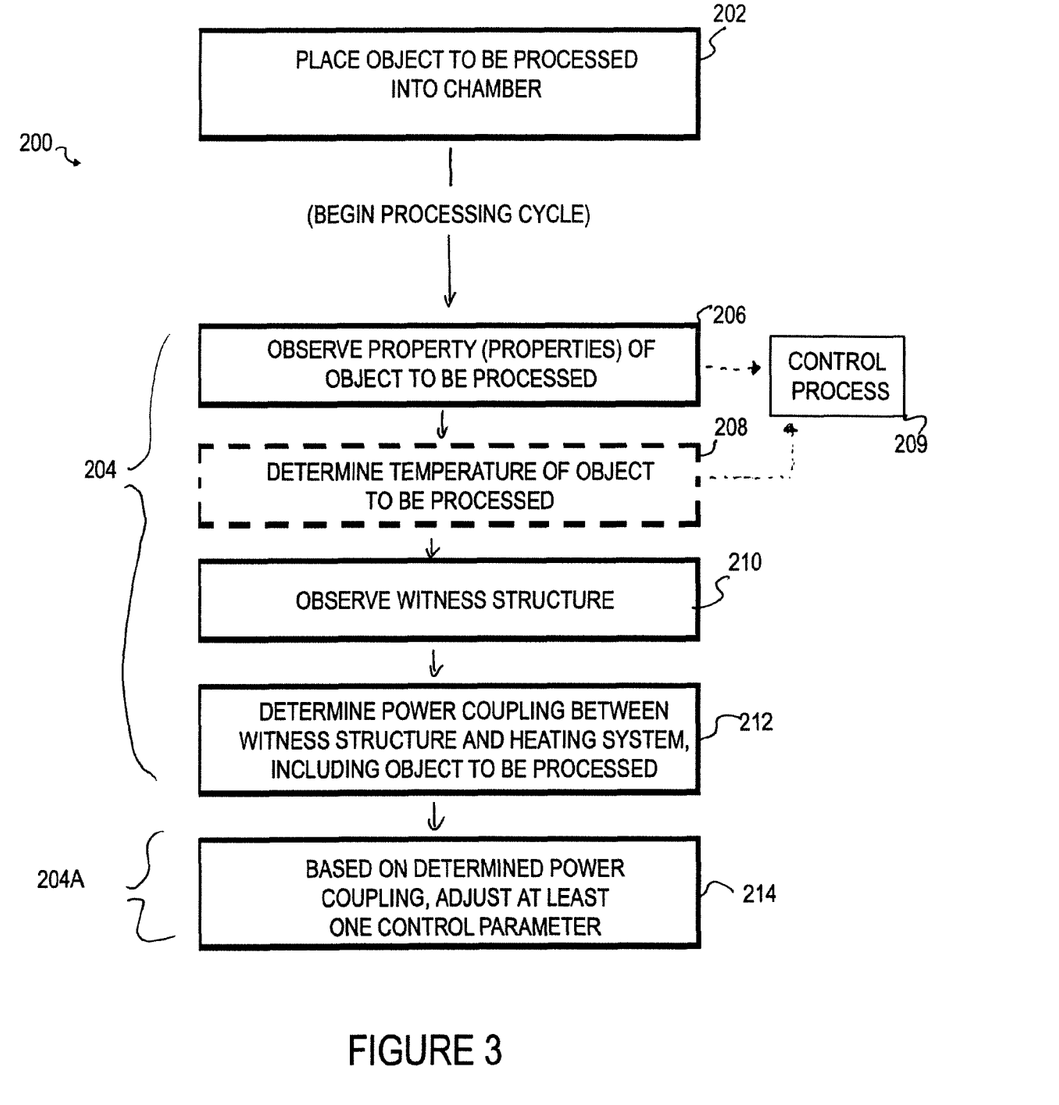
FIG. 3 is a flowchart showing steps in an exemplary method for thermally processing an object, including use of a witness structure to adjust one or more control parameters used in closed-loop control of the process based on monitoring the object to be processed.

FIG. 3 is a flowchart showing exemplary steps in a method 200 for thermally processing an object. In this example, one or more witness structures are observed during a process cycle. The process cycle is controlled based on one or more control parameters and monitoring one or more wafer properties, such as the wafer temperatures. The thermal response of the witness structure is used as a basis for adjusting the control parameter(s) during and/or after the process.

The particular type and number of control parameters will vary. For instance, a relatively basic feedback loop may include a series of coefficients that adjust lamp power settings based on temperature readings from one or more points on the wafer. As another example, a detailed theoretical model of the chamber and wafer may be defined by a plurality of parameters, with temperature readings and model data used to determine settings for the heating system. Of course, regardless of the control system, other properties of the wafer (or other object being processed) may factor into the feedback system.

As shown in FIG. 3 at 202, initially an object to be processed (e.g., a wafer) is placed into a thermal processing chamber containing a witness structure. Then, as indicated generally at 204, a processing cycle is performed. As indicated at 206, one or more properties of the object to be processed are observed some time after a processing cycle has begun. Step 208 is shown in phantom since, in this example, the temperature of the object to be processed is determined from the observed property (properties). However, in other embodiments, the temperature need not be determined if the control model or algorithm depends on properties other than temperature.

In any event, the observed property, whether temperature, one or more other properties, or a signal indicative thereof, is used to control the process cycle as indicated at 209. However, other activity also occurs during the processing cycle.

Namely, as shown at 210, the witness structure is also observed. For instance, the temperature of the witness structure may be observed via one or more measurement devices, such as a pyrometer, thermocouple, or other measurement arrangement. As shown at 212, based on the observation, the power coupling between the heating system and witness structure is determined. The object to be processed can be included in the determination in some embodiments. For example, step 212 may represent determining both the power coupling between the witness structure and the heating system, and determining the coupling between the heating system and the object to be processed. In other embodiments, the power coupling that is determined may be between the witness structure and multiple heating sources, such as between the witness structure and the heating system taken together with the object to be processed. Thus, the object to be processed need not always be included in the power coupling determination. Although failure to account for power coupling between the object to be processed and the witness structure could result in a loss of accuracy in some instances, the heating effects of the object to be processed could be addressed elsewhere in the control scheme.

Step 214 comprises adjusting at least one control parameter based on the determined power coupling. Step 214 is grouped at 204A since step 214 may or may not occur during a process cycle. Namely, in some embodiments, step 214 occurs during a process cycle, and may even occur in real-time. However, in other embodiments, control parameters are not adjusted until after a process cycle is complete.

It should be understood that, although the steps are presented in sequence, the order may be varied and some of the steps can occur in parallel. For instance, in some embodiments, the process will be controlled (step 209) for the entire process, or only during a closed-loop portion. The witness structure and object being processed may each be monitored simultaneously and on an ongoing basis, with the temperature of the object to be processed and power coupling updated accordingly as new data comes in to the controller.

The particular control parameters which are updated, and the effects of such updates, will depend on the control arrangement that is used. In some embodiments, the control system is updated to improve the energy density uniformity across the object to be processed. For example, if a heating system is controllable so as to direct energy to a plurality of zones across the object, the parameter can change the amount of energy applied to one or more zones relative to one another to improve energy density or temperature uniformity. As another example, the parameter can be changed so that a targeted temperature is matched more closely.

The control parameters can also be used to fine-tune or calibrate a model as noted above, such as a thermal model of the process chamber used for temperature control and/or wafer temperature uniformity purposes. For example, various models of the chamber may be used to control lamps in zone-based heating based on temperature feedback from the wafer. Such a model can include the witness structure, and after the power coupling is determined, the model can be adjusted to more closely match the actual results.

Particularly, in certain embodiments, the adjusted control parameter(s) may affect lamp power ratios in heating systems comprising multiple lamps. Thus, temperature distribution across the object to be processed can be better controlled.

B. Using Witness Structure for "Record and Playback" Control

In some embodiments, a witness structure may advantageously be used for what is sometimes termed "record and playback" control. Specifically, the heating system is commanded so that one or more properties of interest of the witness structure follow a predetermined trajectory determined in an initial "training" cycle, which alternatively may be deemed a "master" cycle. For example, the property of interest that is monitored and compared against the stored trajectory may be a temperature of the witness structure (or a value or signal indicative of temperature).

Figure 4:
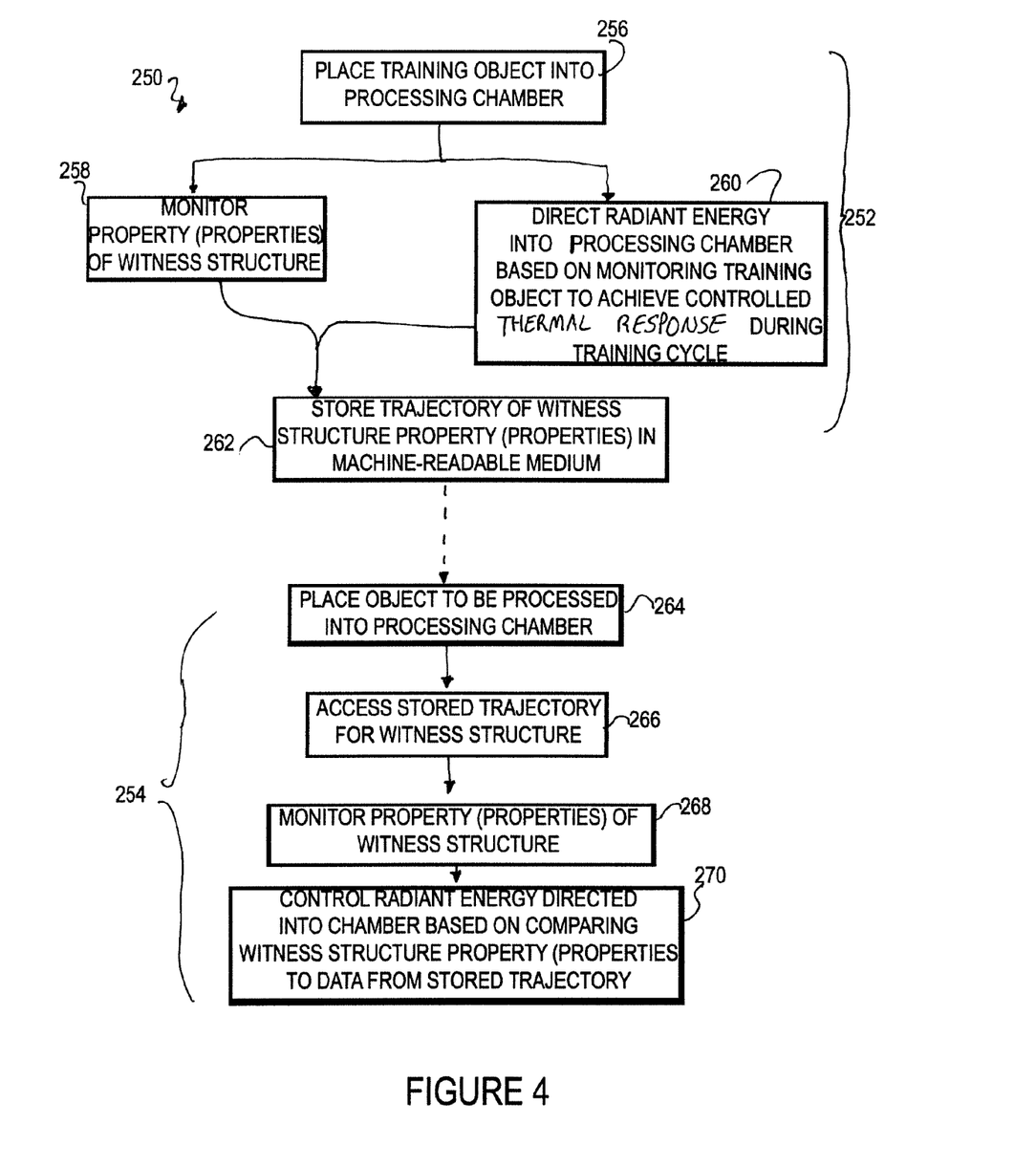
FIG. 4 is a flowchart showing steps in an exemplary method for thermally processing an object, including matching the trajectory of a property of interest for a witness structure to a stored trajectory obtained earlier during a training cycle.

FIG. 4 is a flowchart showing exemplary steps in a method 250 of thermally processing one or more objects. Method 250 has two sub-categories, "training" cycle 252 and production cycle 254.

Training cycle 252 represents an initial set of steps used to prepare a temperature trajectory for use in one or more subsequent processing cycles. During the training cycle of this example, the temperature of the object to be processed is controlled using any suitable technique. However, in other embodiments, other aspects of the thermal response of the training object could be controlled. As an example, if the heating system comprises a plurality of lamps, the power ratio of at least one lamp relative to another lamp could be varied in order to achieve a desired temperature distribution across the training object.

At step 256, a training object is placed into the thermal processing chamber. The training object may, for example, comprise the first of a set of wafers that are to undergo the same process sequence. As another example, the training object may comprise a specially-constructed wafer designed to simulate or mimic the expected thermal characteristics of process wafers. Although this example discusses a single witness structure, the technique could be used with multiple witness structures.

In any event, steps 258 and 260 represent steps that occur during the training cycle and so such steps are illustrated in parallel. Namely, as shown at 258, one or more properties of the witness structure are monitored or observed over time. For example, the temperature of the witness structure may be observed. However, the stored trajectory can represent any monitored property (or properties) of the witness structure over the course of the training cycle.

As shown at step 260, during this time, radiant energy is directed into the processing chamber based on monitoring the training object in order to achieve a controlled temperature trajectory, or other desired thermal response, for the training object during the training cycle. For example, by monitoring the temperature of the training object at multiple locations during the training cycle, a uniform temperature distribution can be achieved during the training cycle. Of course, one or more other properties of the training object may be used to control the training cycle in addition to or instead of temperature.

In certain embodiments, the radiant energy is controlled so that a desired power distribution across the training object is achieved. For example, if the heating system comprises lamps controllable on a zone-by-zone basis, then the lamps can be controlled to achieve a desired temperature distribution across the training object (e.g. to achieve a uniform temperature distribution) as mentioned above.

At step 262, the trajectory of the monitored property (or properties) of the witness structure derived during the training cycle is stored in a machine-readable medium. Any suitable medium can be used, such as a computer-readable memory device (e.g. RAM, ROM, magnetic disk, flash memory, and the like). Generally, the machine-readable medium should be accessible for later use in one or more subsequent processing cycles. Typically, after the training cycle, the training object is removed from the chamber.

A subsequent process cycle is indicated generally at 254. Some time after the training cycle is complete, the stored trajectory can be used to perform closed-loop control with regard to the property (or properties) of interest of the witness structure. Since the stored trajectory for the witness structure is the result of achieving a controlled thermal response for the training object, the resulting thermal response for the object to be processed should ideally match the controlled thermal response.

For example, if the training cycle proceeds with a controlled temperature trajectory for the training object, then the resulting temperature trajectory for one or more subsequent objects to be processed should match the controlled temperature trajectory. As another example, if the stored trajectory for the witness structure is based on achieving another trajectory, such as a desired temperature distribution over time for the object to be processed, the resulting temperature distribution over time should match the controlled temperature distribution.

Of course, the degree of match will depend on factors including the similarity or dissimilarity of the training object and the object to be processed.

As shown at 264, the object to be processed is placed into the processing chamber containing the witness structure, and at step 266 the stored trajectory of the property (or properties) of interest for the witness structure is accessed. Generally, better results can be obtained when the chamber and witness structure used in a process cycle controlled based on a stored trajectory are the same chamber and witness structure used to generate the stored trajectory.

Steps 268 and 270 represent activity during the processing cycle. Namely, at step 268, the property or properties of interest of the witness structure are monitored, and at step 270 the radiant energy directed into the chamber is controlled based on comparing the monitored property (properties) of the witness structure to the data from the stored trajectory. For example, if the monitored property of the witness structure is temperature, the temperature of the witness structure can be controlled so as to match (or attempt to match) the stored temperature trajectory from the training cycle.

As another example, the distribution of power in the chamber can be controlled, such as by varying the ratio of power between various lamp zones in order to match the temperature (or other) trajectory of the witness structure to the stored trajectory.

C. Witness Structure as Heat Flux Sensor

Figure 5:
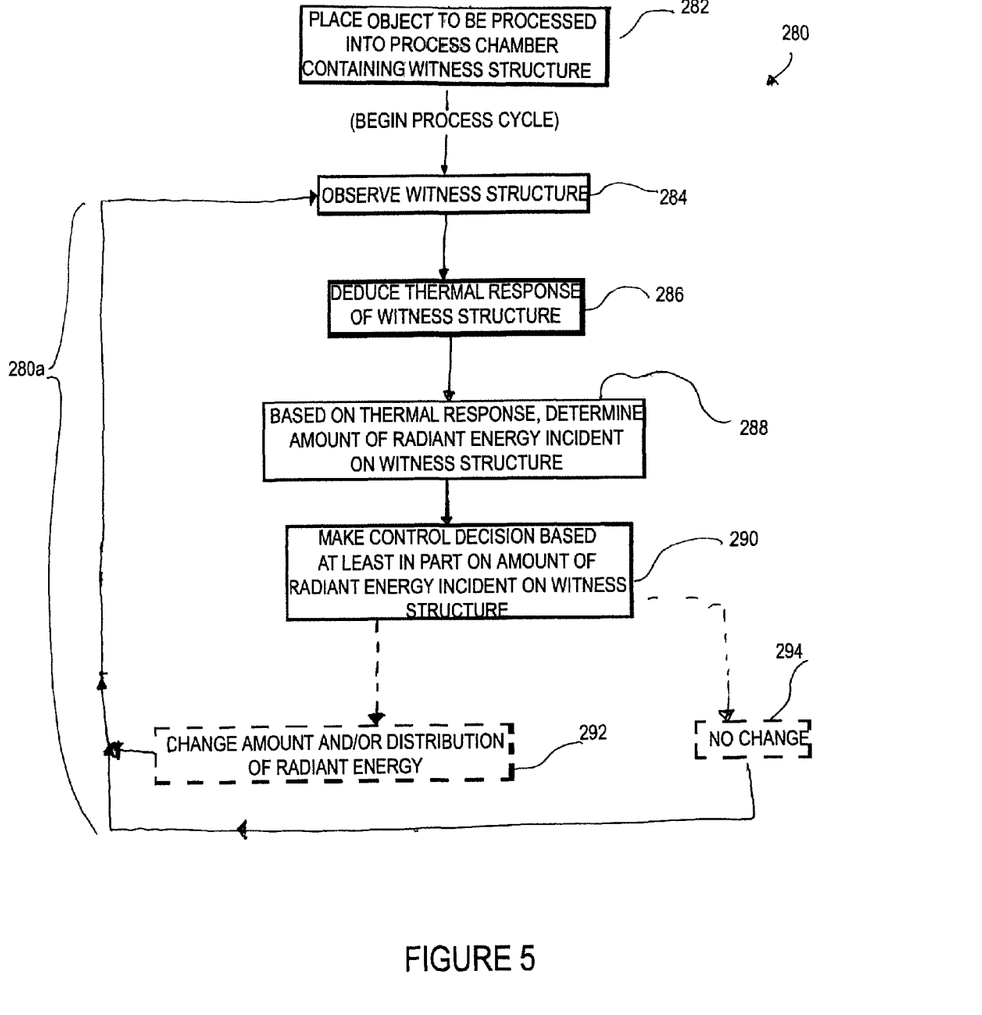
FIG. 5 is a flowchart showing steps in an exemplary method for thermally processing an object in which one or more control decisions are based on determining the amount of radiant energy incident on a witness structure in the chamber.

In some embodiments, a witness structure may advantageously allow for control based on determining heat flux in the chamber. FIG. 5 is a flowchart showing steps in an exemplary method 280 for thermally processing an object based on determining heat flux.

As a preliminary step, at 282, the object to be processed is placed into a process chamber containing one or more witness structures. Some time afterward, the process cycle begins, with steps that occur during the process cycle indicated by 280A. Although steps are illustrated in sequence for purposes of discussion, it should be understood that some or all steps could proceed in parallel or in another order as is appropriate.

At 284, the witness structure is observed. For example, one or more properties of the witness structure may be measured using a pyrometer, thermocouple, or other device as noted previously. At step 286, the thermal response of the witness structure is deduced based on data produced by the measurement device(s) observing the witness structure. For example, the thermal response may be deduced by monitoring the witness structure temperature over time.

In any event, at step 288, the amount of radiant energy incident on the witness structure is determined. Put another way, the energy flux through the portion of the chamber occupied by the witness structure is determined from its thermal response. This determination should follow from available information about the witness structure's dimensions and thermal properties.

Energy incident on the witness structure can originate from a number of sources, including, but not limited to, the heating system of the chamber. For example, radiant energy may be emitted or scattered by the chamber walls or wafer(s) being processed. At step 290, a control decision can be made based at least in part on the amount of radiant energy determined to be incident on the witness structure. Such a control decision can, in some embodiments, consider the various potential sources of radiant energy. The term "control decision" is not meant to imply that software is required. For instance, the "control decision" may be made as a result of a hardware configuration that commands different results based on different signal values representative of radiant energy incident on the witness structure.

In some embodiments, the amount of radiant energy incident on the wafer can be considered in making a control decision or taking other actions. However, in other embodiments, the control decision is made without regard to determining the amount of radiant energy incident on the wafer. For example, the witness structure could be appropriately configured and positioned in the chamber so that a model or correction factor could be used without considering the status of the wafer. This could greatly simplify the measurement and control system, since complex instrumentation for monitoring the wafer would not be necessary.

The particular control decision (or decisions) will vary according to the particular control implementation for the chamber. In this example, two alternative steps 292 and 294 are available. Step 294 represents no change in the radiant energy, while step 292 represents a change in the amount and/or distribution of radiant energy directed into the chamber.

Other steps could be taken as a result of the control decision performed at 290. As another example, the amount of radiant energy incident on the structure can be used to improve a thermal model of the thermal processing system or to adjust control parameters or for providing an alarm or interlock in the event of an error condition.

CONCLUSION

Control systems based on measurement of wafer properties (e.g. temperature) for comparison to a stored or ideal trajectory rely on precise measurements across a wide range of process temperatures and other conditions. This may not be ideal when the properties of interest are difficult to measure. As an example, it may be difficult to accurately monitor the temperature of a highly-reflective wafer across a broad temperature range. By controlling the wafer temperature open-loop, but controlling a witness structure temperature closed-loop, better results may be achieved since the witness structure can be customized in order to make measurements easier.

Furthermore, in some instances, the measurement devices used to observe the witness structure can be much simpler than devices used to observe objects being processed. For example, rather than using complex arrangements of optics and the like in order to account for changes in wafer optical properties, stray light effects, and the like, a simpler instrumentation can be used, with the witness structure's properties chosen for maximum compatibility with the simpler measurement system.

The overall control scheme can also be greatly simplified, leading to potential reductions in hardware/software costs and/or attendant maintenance and support requirements. For example, rather than using a complex updating procedure based on wafer properties, a thermal model can be updated based on assumptions and data regarding the thermal coupling and/or radiation flux at the witness structure.

Several examples herein discuss using a witness structure "during a process cycle." This phrase is intended to cover use of techniques at any suitable point or points during which a thermal processing system is operated. Methods may be used to control the system at multiple times during a single process, during only part of a process, or over an entire process. For example, methods in accordance with the present subject matter may be performed during part of a particular operating sequence, such as in a stage during which high-temperature processing or other activity is performed, during a steady-state stage, a preheating stage and/or during a post-processing stage (e.g. cool-down).

The ultimate action(s) taken by a system controlled in accordance with one or more aspects of the present subject matter can vary. For instance, several examples herein use one or more aspects for temperature control. Additionally or alternatively, though, the control "results" can be used to trigger interlocks, alarms, status indicators, or as indications to begin or end processing steps. As another example, the control "results" can be used to trigger or select between different control programs, recipes, and the like. Still further, the results can be used for fine adjustment of hardware or control algorithms and/or correction or optimization of chamber parts. Finally, as noted earlier, a model for the process chamber can be calibrated/adjusted for wafer temperature uniformity tuning and/or control.

The use of headings, letters, numbers, or other listing criteria in this document is not meant as a limitation, but is only intended as an aid to the reader.

It is appreciated by persons skilled in the art that the presently disclosed subject matter is not limited in scope by what has been particularly shown and described above, which constitute various examples. As set forth in the attached claims, the scope includes both combinations and sub-combinations of various features discussed herein, along with such variations and modifications as would occur to a person of skill in the art.

What is claimed is:

1. A method for thermally processing an object in a thermal processing chamber, the method comprising:
    placing an object to be processed in a thermal processing chamber containing a witness structure, the thermal processing chamber being in association with a measurement device, wherein the measurement device has previously monitored a property of the witness structure over a time interval to produce stored data, and wherein the measurement device comprises either a light pipe embedded in the body of the witness structure or a pyrometer;
    performing a processing cycle, including directing radiant energy into the chamber via a heating system, wherein the heating system is controllable so as to direct energy to a plurality of zones of the object to be processed; and during the process cycle:
    observing a property of the witness structure using the measurement device,
    comparing the property of the witness structure observed to the stored data produced by the measurement device over the time interval;
    deducing the thermal response of the witness structure based on the comparison of the property of the witness structure observed to the stored data produced by the measurement device over the time interval,
    determining the amount of radiant energy incident on the witness structure based on the thermal response of the witness structure,
    making a control decision based on the amount of radiant energy determined to be incident on the witness structure, and
    changing the amount of radiant energy directed into the chamber and applied to a zone of the object relative to another zone of the object to thereby adjust a temperature distribution across the object if warranted by the control decision.

2. The method set forth in claim 1, wherein changing the radiant energy comprises changing the total amount of radiant energy directed into the chamber by the heating system.

3. The method set forth in claim 1, wherein the control decision is made without regard to determining the amount of radiant energy determined to be incident on the object to be processed.

* * * * *